United States Patent [19]
Sim

[11] Patent Number: 6,072,347
[45] Date of Patent: Jun. 6, 2000

[54] DELAY LOCKED CIRCUIT

[75] Inventor: Jae-Kwang Sim, Cheongju, Rep. of Korea

[73] Assignee: LG Semicon Co., Ltd., Cheongju, Rep. of Korea

[21] Appl. No.: 09/064,034

[22] Filed: Apr. 22, 1998

[30] Foreign Application Priority Data

May 7, 1997 [KR] Rep. of Korea .................. 17388/1997

[51] Int. Cl.[7] ........................................................ H03L 7/06
[52] U.S. Cl. .......................... 327/276; 327/141; 327/160; 327/161; 327/276; 327/279
[58] Field of Search ..................................... 327/141, 158, 327/160, 161, 276, 279

[56] References Cited

U.S. PATENT DOCUMENTS 5,173,617  12/1992  Alsup et al. ............................. 327/158

Primary Examiner—Timothy P. Callahan
Assistant Examiner—Cassandra Cox

[57] ABSTRACT

A circuit and method for performing a delay locked function for correcting phase differences between an input clock signal RCLK and an internally generated clock signal ICLK and for controlling the correcting step to maintain an accurate locking operation when a phase difference is below a threshold valve (the maximum time for which the internal step jitter may occur). The circuit includes an earlier state detection unit for delaying an input clock signal RCLK for a predetermined time and comparing a phase of an input clock signal RCLK with a phase of an internal clock signal ICLK, a later state detection unit for delaying the internal clock signal ICLK for a predetermined time and comparing a phase of the internal clock signal ICLK with the phase of the input clock signal RCLK, a delay controller for outputting a control signal for determining a delay time of the input clock signal RCLK in accordance with a comparison result by the earlier state detection unit and the later state detection unit, and a variable delay unit for delaying the input clock signal for a predetermined time in accordance with a control signal from the delay controller and outputting an internal clock signal ICLK.

18 Claims, 5 Drawing Sheets

DELAY LOCKED CIRCUIT

BACKGROUND OF THE INVENTION

1. Field of the Invention

The present invention relates to a delay locked circuit, and more particularly to an improved delay locked circuit which is capable of maintaining a locked state based on a phase difference between an input clock signal and an-internal signal.

2. Description of the Conventional Art

FIG. 1 illustrates a conventional delay locked circuit. The conventional delay circuit of FIG. 1 includes a phase detection unit 1 for comparing the phase of an input clock signal RCLK with the phase of an internal clock signal ICLK, a delay controller 2 for outputting two control signals Vp and Vn which determine the delay skew of the input clock signal RCLK in accordance with a result of the phase detection unit 1, and a variable delay unit 3 for outputting an internal clock signal ICLK by delaying the input clock signal RCLK based on two control signals Vp and Vn.

The phase detection unit 1 is a D flip-flop for receiving an input clock signal RCLK through an input terminal CLK and an internal clock signal ICLK through an input terminal D.

The operation of the conventional delay locked unit will now be explained with reference to FIGS. 2 through 5.

An input clock signal RCLK is externally inputted into a clock signal terminal CLK of the phase detection unit 1 and the variable delay unit 3, respectively. In the variable delay unit 3, the signal RCLK is delayed as much as one full period of is the signal RCLK based on the control signals Vp and Vn from the delay control unit 2. The delayed clock signal, output from variable delay unit 3, is known as an internal clock signal ICLK.

The phase detection unit 1 determines a logic state of the output signal in accordance with a logic state of the internal clock signal ICLK and a rising edge of the input clock signal RCLK.

When a low level input clock signal RCLK is input into the delay controller 2, the input clock signal RCLK is delayed for a predetermined time by two inverters I1 and I2, after which the transmission gate T1 is turned on. The internal clock signal ICLK is delayed by two inverters I4 and I5, is passed through the transmission gate T1, and is latched by the inverters I6 and I7.

When the level of the input clock signal RCLK is changed to a high level, the transmission gate T1 is turned off, and the transmission gate T3 is turned on. The internal clock signal ICLK latched by the inverters I6 and I7 passes through the transmission gate T3, is inverted by the inverter I8, and then is output to the output terminal Q. The signal is also inverted by the inverter I10 and is output to the output terminal QB.

When the internal clock signal ICLK has a high level state at a rising edge of the input clock signal RCLK, the logic state of the signal output from the output terminal Q becomes a high level, and the logic state of the signal output from the output terminal QB becomes a low level. The timing related to the signal is shown in FIG. 3A.

The operation of the delay controller 2 and the variable delay unit 3 will now be explained with particular reference to FIGS. 4 and 5.

The PMOS transistor P42 is turned off and the NMOS transistor N41 is turned on when the bias generator 41 of the delay controller 2 outputs a bias voltage, the enable signal PWON is a high state, the signal outputted from the output terminal Q of the detection unit 1 is a high level, and the signal outputted from the output terminal QB is a low level. While PMOS transistor P42 is turned off and the NMOS transistor N41 is turned on, the electric charge stored by capacitor C is discharged by the resistor R and the NMOS transistors N41, N42 and N43.

The level at the output terminal Vn is decreased, while the level at the output terminal Vp is increased. Therefore, the resistances of a plurality of PMOS transistors (P51,. P53, . . . , Pn) of the variable delay unit 3 are increased, and the resistances of a plurality of NMOS transistors (N51, N53 . . . , Nn) are increased.

The time for which the input clock signal RCLK passes through inverter I51 including transistors P52 and N52 and inverter I52 including transistor P54 and N54 is increased. When the input clock signal RCLK is at a rising edge, the phase difference between the input clock signal RCLK and the internal clock signal ICLK is decreased.

FIG. 3B illustrates a timing diagram of signals output from the terminals Q and QB when the phase of the internal clock ICLK is earlier than the phase of the input clock signal RCLK. If the logic states of the signals output from the output terminals Q and QB are opposite to the logic state shown in FIG. 3B, the delay controller 2 and the variable delay unit 3 are reversely operated.

Namely, the PMOS transistor P42 of the delay controller 2 is turned on, and the NMOS transistor N41 is turned off, causing capacitor C to be charged by the power voltage VDD. Therefore, the level of the output terminal V is increased, and the level of the output terminal V is decreased, causing the delay unit 3 to reduce a delay time of the input clock signal RCLK.

Moreover, based on the input clock signal RCLK, the conventional delay locked circuit determines whether the phase of the internal clock signal ICLK is earlier or later than the phase of the input clock signal RCLK. As a result of the judgement, if the phase of the internal clock signal ICLK is earlier than the phase of the input clock signal RCLK, the delay of the internal clock ICLK is extended. By contrast, if the phase of the internal clock signal ICLK is later than the phase of the input clock signal RCLK, the delay of the internal clock signal ICLK is shortened. For that reason, the conventional system operates in two modes.

In this system, if the phase of the internal clock signal ICLK is slightly earlier than the phase of the input clock signal RCLK, the phase of the internal clock signal ICLK becomes slower than the phase of the input clock signal ICLK in the next stage. The above-described two modes are therefore continuously operated.

Specifically, when the delay locked loop is clocked, the phase of the internal clock signal is always either earlier or later than the phase of the input clock signal RCLK. As shown in FIG. 3C, since there is always a predetermined time difference between the phases of two clock signals, an internal step jitter problem occurs, rendering it impossible to obtain an accurate locking operation using the conventional system.

SUMMARY OF THE INVENTION

It is an object of the present invention to provide a delay locked circuit which overcomes the aforementioned problems encountered in the conventional systems.

It is another object of the present invention to provide an improved delay locked circuit which is capable of obtaining an accurate locking operation by detecting an operational state when a phase difference between an input clock signal RCLK and an internal clock signal ICLK is below a predetermined time (the maximum time for which the internal step jitter may occur).

To achieve the above and other objects and advantages, there is provided a delay locked circuit which includes a detection unit detecting a phase difference between at least two signals and comparing the phase difference to a threshold value, a delay controller controlling whether a change is made in a delay of at least one of the signals based on the comparison between the phase difference and the threshold value, and a variable delay for changing the delay when the detected phase difference exceeds the threshold value and for maintaining the delay when the detected phase difference does not exceed the threshold value.

The detecting unit includes an earlier state detection unit for delaying the input clock signal for a first predetermined time and for comparing a phase of the delayed input clock signal to a phase of the internally generated clock signal, and a later state detection unit for delaying the internally generated clock signal for a second predetermined time and for comparing a phase of the delayed internally generated clock signal to a phase of the input clock signal. The later state detection unit includes a second delay unit for delaying the internally generated clock signal for the second predetermined time, and a second phase detection unit for comparing a phase of the delayed internally generated clock signal output from the second delay unit with the phase of the input clock signal. The delay controller generates a control signal representing a delay time based on at least one of the comparisons performed in the detecting unit, the delay of the input clock signal being controlled by the variable delay unit in accordance with the control signal generated by the delay controller. The earlier state detection unit includes a first delay unit for delaying the input clock signal for the first predetermined time, and a first phase detection unit for comparing a phase of a signal output from the first delay unit with the phase of the internal clock signal.

Additionally, the above and other objects and advantages can be achieved by a method of performing a delay locking function, including detecting a phase difference between two signals, comparing the phase difference to a threshold value, controlling whether a change is made in a delay imposed on at least one of the signals based on the comparison between the phase difference and the threshold value, changing the delay when the detected phase difference exceeds the threshold value, and maintaining the delay when the detected phase difference does not exceed the threshold value. The detecting step includes delaying the input clock signal and comparing a phase of the delayed input clock signal to a phase of the internally generated clock signal, and delaying the internally generated clock signal and comparing a phase of the delayed internally generated clock signal to a phase of the input clock signal. The controlling step includes generating a control signal representing a delay time based on at least one of the comparisons performed in the detecting step, and controlling a delay of the input clock signal and the internally generated clock signal in accordance with the control signal.

In either case, the first predetermined time may represent a difference between a minimum delay time and a maximum delay time for which the variable delay unit delays the input clock signal, and the second predetermined time represents a difference between a minimum delay time and a maximum delay time for which the variable delay unit delays the input clock signal. The threshold value may represent a difference between a minimum and maximum amount of the delay, a first of the signals may be an internally generated clock signal, and a second of the signals may be an input clock signal.

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
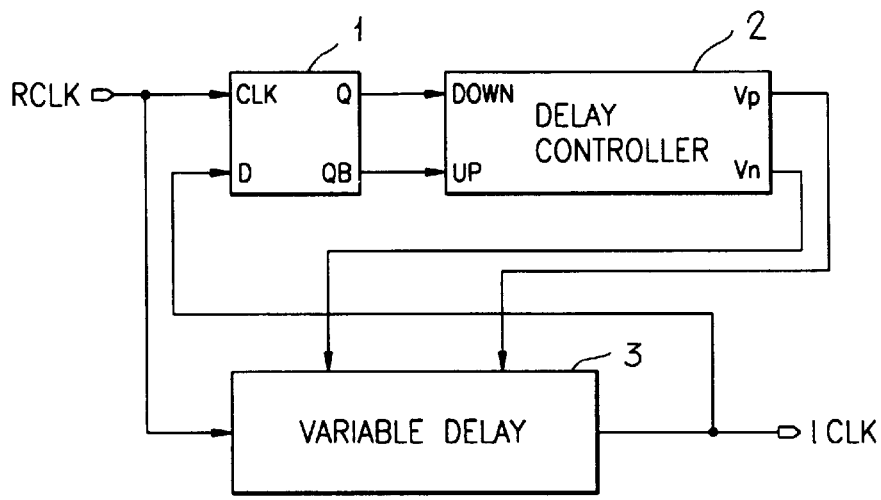
FIG. 1 is a schematic block diagram illustrating a conventional delay locked circuit.
Figure 2:
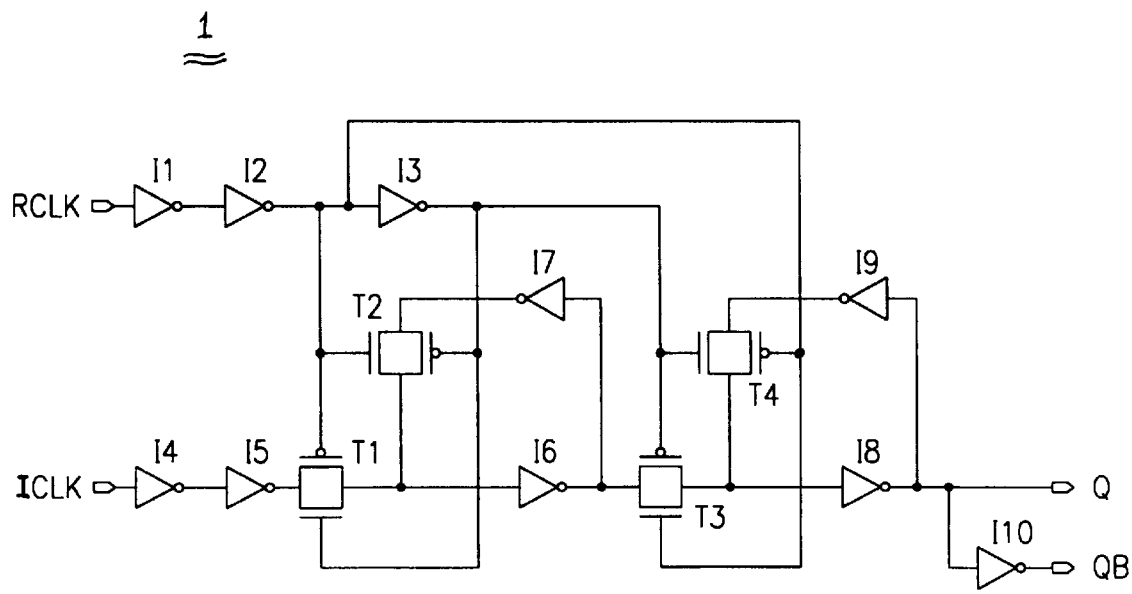
FIG. 2 is a detailed circuit diagram illustrating a phase detection unit in the circuit of FIG. 1.
Figure 3A:
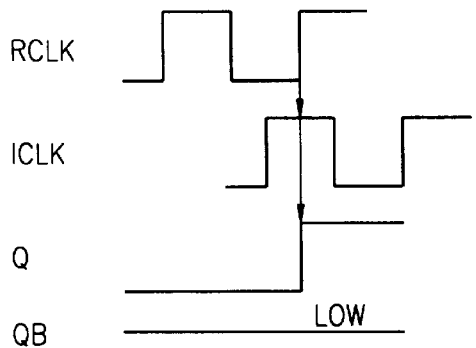
FIGS. 3A through 3C are timing waveforms of input/output signals from a phase detection unit in the circuit of FIG. 1.
Figure 3B:
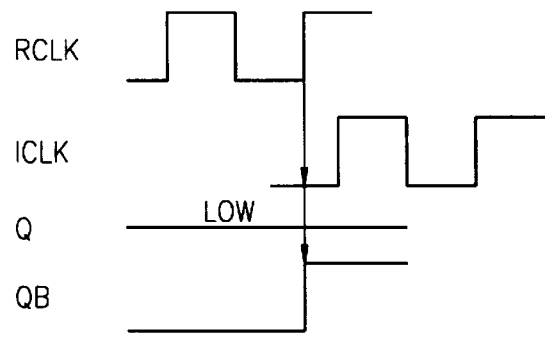
Figure 3C:
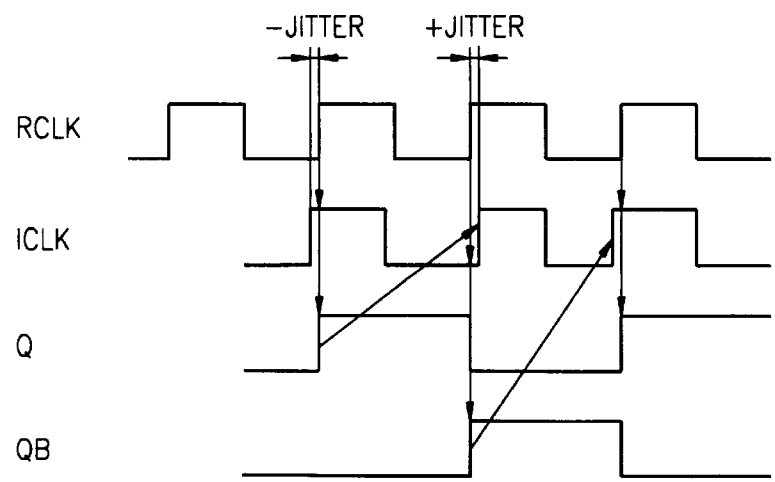
Figure 4:
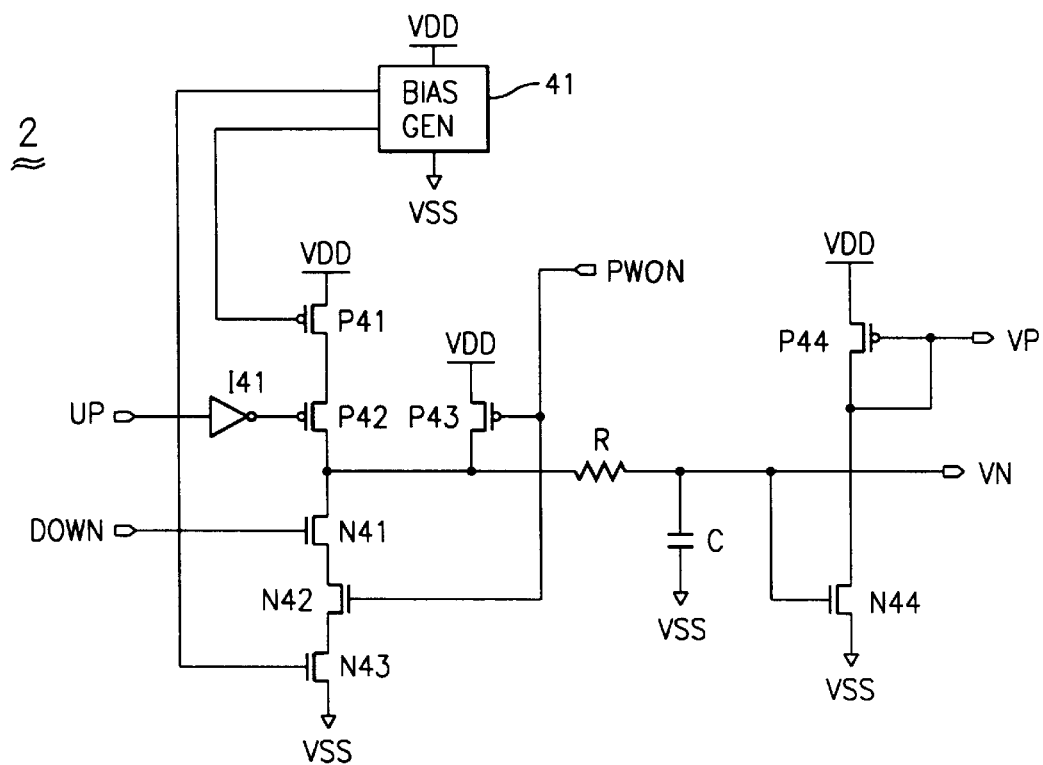
FIG. 4 is a detailed circuit diagram illustrating a delay controller in the circuit of FIG. 1.
Figure 5:
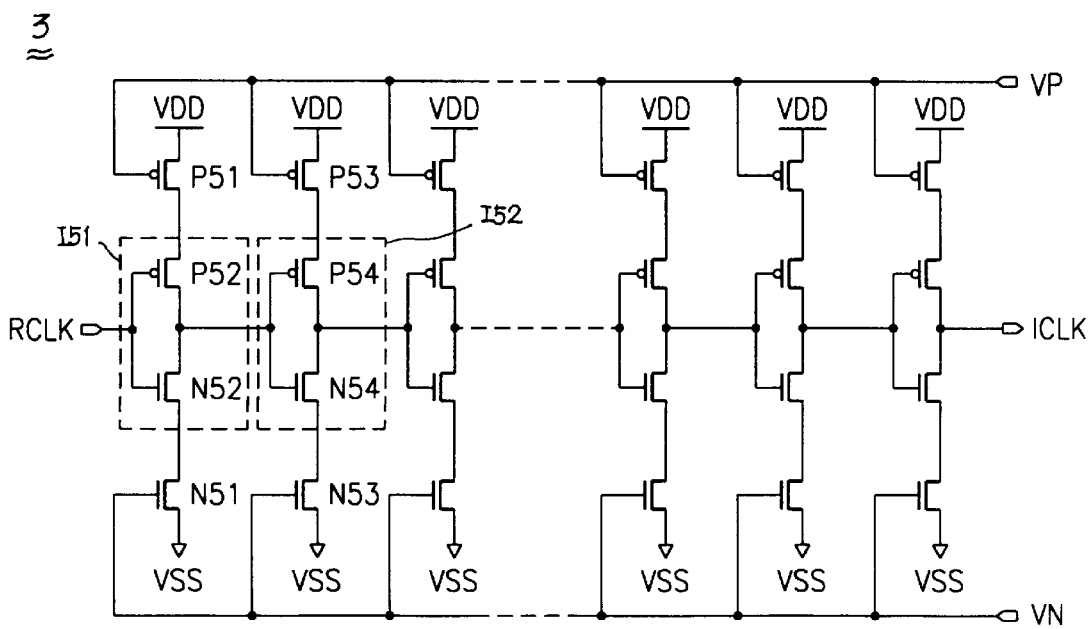
FIG. 5 is a detailed circuit diagram illustrating a variable delay unit in the circuit of FIG. 1.
Figure 6:
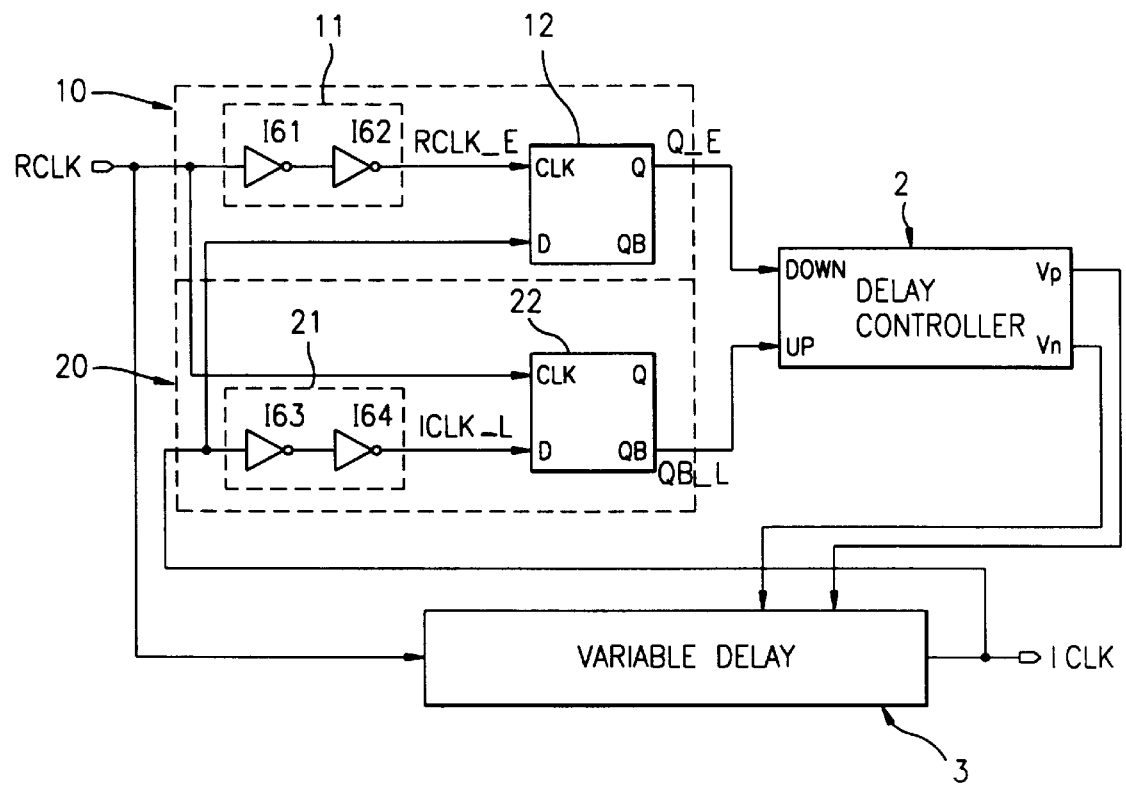
FIG. 6 is a circuit diagram illustrating a delay locked circuit according to a preferred embodiment of the present invention.

FIG. 6 illustrates a preferred embodiment of the delay locked circuit according to the present invention. The delay locked circuit according to this preferred embodiment of the present invention includes an earlier state detection unit 10 for judging whether a phase of an internal clock signal ICLK is earlier than the phase of an input clock signal RCLK and for is outputting a signal Q_E based on the judgement, a later state detection unit 20 for judging whether the phase of the internal clock signal ICLK is later than the phase of the input clock signal RCLK and for outputting a signal QB_L based on the judgement, a delay controller 2 for receiving the signals Q_E and QB_L and outputting control signals Vp and Vn for determining a delay time of the input clock signal RCLK, and a variable delay unit 3 for delaying the input clock signal RCLK in accordance with the control signals Vp and Vn and for outputting the earlier internal clock signal ICLK.

The earlier state detection unit 10 includes a first delay unit 11 for delaying the input clock signal RCLK for a predetermined time, and a first phase detection unit 12 for comparing the phase of the output signal from the first delay unit 11 with the phase of the internal clock signal ICLK.

The later state detection unit 20 includes a second delay unit 21 for delaying the internal clock signal ICLK for a predetermined time, and a second phase detection unit 22 for comparing the phase of the output signal from the second delay unit 21 with the phase of the input clock signal RCLK.

The first and second delay units 11 and 21 each have a pair of inverters, inverters I61 and I62 in is first delay unit 11 and inverters I63 and I64 in second delay unit 21. The first and second phase detection units 12 and 22 are D flip-flops.

Figure 7A:
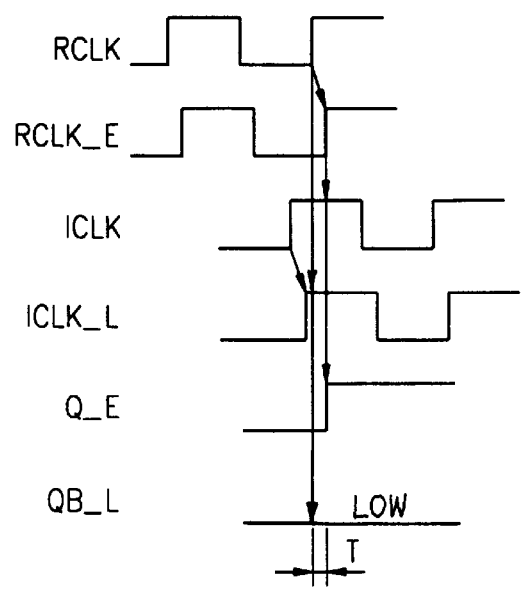
FIGS. 7A through 7C are timing waveforms of input/output signals from a phase detection unit in the circuit of FIG. 6.
Figure 7B:
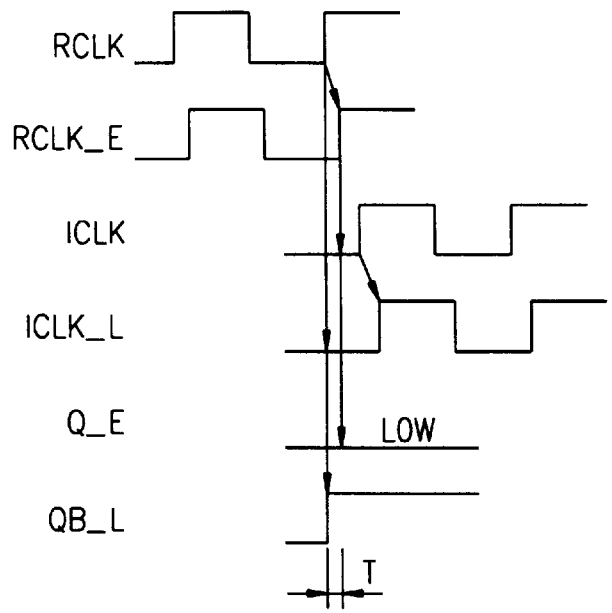

The operation of the delay locked circuit according to the present invention will now be explained with particular reference to FIGS. 7A–7C.

The input clock signal RCLK is delayed by the first delay unit 11 and is output as a new signal RCLK_E. The first phase detection unit 12 compares the phase of the signal RCLK_E with the phase of the internal clock signal ICLK, and outputs a signal Q_E based on the comparison.

Meanwhile, the internal clock signal ICLK is delayed by the second delay unit 21 and is output as a new signal ICLK_L. The second phase detection unit 22 compares the phase of the signal ICLK_L with the phase of the input clock signal RCLK, and outputs a signal QB_L based on the comparison.

When a rising edge is experienced in the input clock signal RCLK and the phase of the internal clock signal ICLK is earlier than the phase of the input clock signal RCLK in a predetermined interval T, the signal Q_E has a high level and the signal QB_L has a low level. This state is called an early state. FIG. 7A illustrates a timing waveform diagram.

The interval T is a delay time set by the first and second delay units 11 and 21. The delay time is identical to the time of, the step jitter in the conventional art. Namely, the time T corresponds to a difference between the minimum delay time and the maximum delay time for which the variable delay unit 3 delays the input clock signal RCLK.

When the input clock signal RCLK is a rising edge, and the phase of the internal clock signal ICLK is later than the phase of the input clock signal RCLK in the interval T, the signal Q_E becomes a low level and the signal QB_L becomes a high level. This state is known as a later state. FIG. 7B illustrates a waveform diagram of the signals.

Figure 7C:
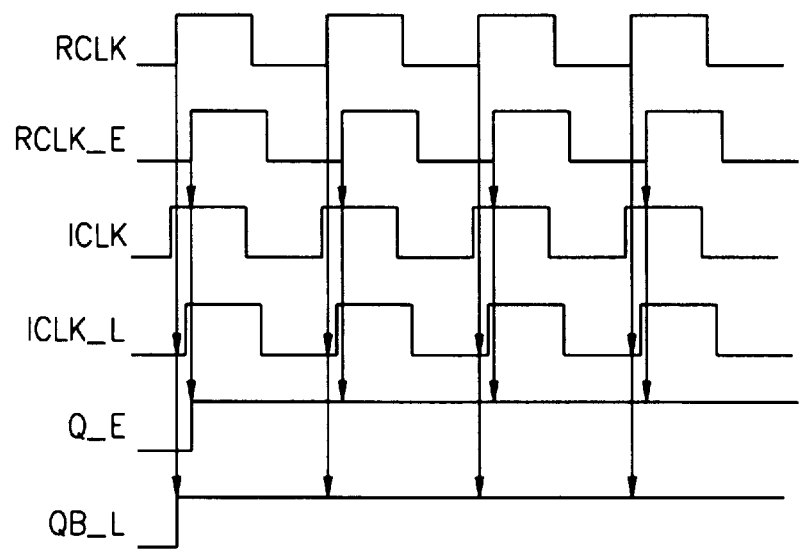

Next, FIG. 7C is used to describe operation when the difference between the phase of the input clock signal RCLK and the phase of the internal clock signal ICLK is smaller than the interval T.

The first phase detection unit 12 compares the phase of the input clock signal RCLK with the phase of the internal clock signal ICLK and outputs a high level signal Q_E, and the second phase detection unit 22 compares the phase of the internal clock signal ICLK with the phase of the input clock signal RCLK and outputs a high level signal QB_L. The state in which the output signals Q_E and QB_L have high levels is called a locked state.

When high level signals Q_E and QB_L are input to the delay controller 2, the NMOS transistor N41 is turned off by the high level signal Q_E, and the high level signal QB_L is inverted by the inverter I41 and is applied to the gate of the PMOS transistor P42 to turn that transistor on. Therefore, all the current of the power voltage VDD flowing at the PMOS transistor P42 flows through the NMOS transistor N41. Therefore, the current and voltage remains unchanged when flowing through the remaining elements, namely, the resistor R, the capacitor C, the NMOS transistor N44, and the PMOS transistor P44. As a result, the levels at the output terminals Vn and Vp and the resistance value at the transistors P51, P53, . . . and N51, N53, . . . of the variable delay unit 3 remain unchanged. For that reason, the delay time of the variable delay unit 3 maintains the delay time of the previous period.

In other words, when the phase difference between the phase of the input clock signal RCLK and the phase of the internal clock signal ICLK is shorter than a predetermined time (e.g., when a locked state occurs), the variable delay unit 3 does not control the delay level.

As described above, the delay locked circuit according to the present invention is directed to controlling a delay time when the phase difference between the phase of the input clock signal RCLK and the phase of the internal clock signal ICLK is greater than a predetermined time, and not controlling the delay time when the phase difference between the phase of the input clock signal RCLK and the phase of the internal clock signal ICLK is smaller than the same. By allowing circuit operation to continue without correction by the delay locked circuit, a locked state is maintained in response to phase differences below a predetermined value. By continuously maintaining a locked state under such conditions, the step jitter does not occur.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed:

1. A delay locked circuit, comprising:

a detection unit detecting a phase difference between at least two signals and comparing the phase difference to a threshold value; and a delay controller controlling whether a change is made in a delay of at least one of the two signals based on the comparison between the phase difference and the threshold value.

2. The delay locked circuit recited by claim 1, wherein the threshold value represents a difference between a minimum and maximum amount of the delay.

3. The delay locked circuit recited by claim 1, further comprising:

a variable delay for changing the delay when the detected phase difference exceeds the threshold value.

4. The delay locked circuit recited by claim 3, wherein the variable delay maintains the delay when the detected phase difference does not exceed the threshold value.

5. The delay locked circuit recited by claim 1, wherein:

a first of the signals is an internally generated clock signal, and a second of the signals is an input clock signal.

6. The delay locked circuit recited by claim 5, wherein the detecting unit comprises:

an earlier state detection unit for delaying the input clock signal for a first predetermined time and for comparing a phase of the delayed input clock signal to a phase of the internally generated clock signal; and a later state detection unit for delaying the internally generated clock signal for a second predetermined time and for comparing a phase of the delayed internally generated clock signal to a phase of the input clock signal.

7. The delay locked circuit recited by claim 6, further comprising:

a variable delay unit for controlling delay of the input clock signal, wherein the delay controller generates a control signal representing a delay time based on at least one of the comparisons performed in the detecting unit, and the delay of the input clock signal is controlled by the variable delay unit in accordance with the control signal generated by the delay controller.

8. The delay locked circuit recited by claim 7, wherein the earlier state detection unit comprises:

a first delay unit for delaying the input clock signal for the first predetermined time; and a first phase detection unit for comparing a phase of a signal output from the first delay unit with the phase of the internal clock signal.

9. The delay locked circuit recited by claim 8, wherein the first predetermined time represents a difference between a minimum delay time and a maximum delay time for which the variable delay unit delays the input clock signal.

10. The delay locked circuit recited by claim 7, wherein the later state detection unit comprises:

a second delay unit for delaying the internally generated clock signal for the second predetermined time; and a second phase detection unit for comparing a phase of the delayed internally generated clock signal output from the second delay unit with the phase of the input clock signal.

11. The delay locked circuit recited by claim 10, wherein the second predetermined time represents a difference between a minimum delay time and a maximum delay time for which the variable delay unit delays the input clock signal.

12. A method of performing a delay locking function, comprising:

detecting a phase difference between two signals;

comparing the phase difference to a threshold value; and controlling whether a change is made in a delay imposed on at least one of the two signals based on the comparison between the phase difference and the threshold value.

13. The method recited by claim 12, wherein the threshold value represents a difference between a minimum and maximum amount of the delay.

14. The method recited by claim 12, further comprising:

changing the delay when the detected phase difference exceeds the threshold value.

15. The method recited by claim 14, further comprising:

maintaining the delay when the detected phase difference does not exceed the threshold value.

16. The method recited by claim 12, wherein:

a first of the signals is an internally generated clock signal, and a second of the signals is an input clock signal.

17. The method recited by claim 16, wherein the detecting step comprises:

delaying the input clock signal and comparing a phase of the delayed input clock signal to a phase of the internally generated clock signal; and delaying the internally generated clock signal and comparing a phase of the delayed internally generated clock signal to a phase of the input clock signal.

18. The method recited by claim 17, wherein the controlling step comprises:

generating a control signal representing a delay time based on at least one of the comparisons performed in the detecting step, and controlling a delay of the input clock signal and the internally generated clock signal in accordance with the control signal.

* * * * *